United States Patent [19]

Chen

[11] 4,346,455
[45] Aug. 24, 1982

[54] CROSSOVER JUNCTION FOR MAGNETIC BUBBLE DOMAIN CIRCUITS

[75] Inventor: Thomas T. Chen, Yorba Linda, Calif.

[73] Assignee: Rockwell International Corporation, El Segundo, Calif.

[21] Appl. No.: 70,237

[22] Filed: Aug. 27, 1979

Related U.S. Application Data

[63] Continuation of Ser. No. 886,972, Mar. 15, 1978, abandoned.

[51] Int. Cl.³ .............................................. G11C 19/08
[52] U.S. Cl. ............................................ 365/16; 365/5
[58] Field of Search ....................... 365/5, 13, 15, 16

[56] References Cited

U.S. PATENT DOCUMENTS

| | | | |
|---|---|---|---|
| 3,723,716 | 3/1973 | Bobeck et al. | 365/13 |
| 3,806,901 | 4/1974 | Buhrer | 365/5 |
| 4,003,037 | 1/1977 | Chang | 365/5 |
| 4,040,018 | 8/1977 | Chang et al. | 365/5 |
| 4,100,608 | 7/1978 | George | 365/16 |
| 4,139,906 | 2/1979 | Chen | 365/15 |

OTHER PUBLICATIONS

AIP Conference Proceedings on Magnetism & Magnetic Materials—No. 18, PT 1, Nov. 13-16, 1973, pp. 95-99.

*Primary Examiner*—James W. Moffitt
*Attorney, Agent, or Firm*—H. Fredrick Hamann; Daniel R. McGlynn

[57] ABSTRACT

A magnetic bubble domain circuit which permits the information in two separate propagation paths to crossover each other without deleterious effects. The crossover junction includes at least two definable propagation paths, a merge device for joining the paths, and an active transfer junction between the two paths. The information on the two paths is arranged to become interleaved or intermixed at the merge and to be separated at the active transfer switch arrangements are made for crossing over a plurality of propagation paths by using information properly timed or spaced, or, in the alternative, using a multiple junction arrangement.

10 Claims, 7 Drawing Figures

CROSSOVER JUNCTION FOR MAGNETIC BUBBLE DOMAIN CIRCUITS

This is a continuation of application Ser. No. 886,972, filed Mar. 15, 1978 and now abandoned.

BACKGROUND OF THE INVENTION

1. Field of the Invention

This invention relates to magnetic bubble Jomain devices, in general, and to circuits for permitting information in separate paths to crossover without difficulties, in particular.

2. Prior Art

The magnetic bubble domain has come of age and is used in many areas. Many magnetic bubble domain devices are now known in the art. In fact, magnetic bubble domain devices are expected to supplant many existing devices either semiconductor or magnetic.

In order to better utilize the magnetic bubble domain device and its related circuitry, many evaluations and design developments have been undertaken. Many systems and related apparatus have been built. However, to date, it has been relatively difficult to cause an information stream in one path to cross an information stream in another path without causing some disturbance in the information streams. In point of fact, crossover of information streams and propagation paths and has not been utilized. This situation exists largely because a satisfactory crossover element has not been considered feasible. However, many components which can be used in fabricating a crossover system or junction are well known. For example, there are many transfer switches available, merge junctions are known, and propagation path elements are provided. However, the appropriate combination thereof has not been proposed in order to make an efficient, functioning component.

PRIOR ART STATEMENT

The most pertinent prior art which is known to applicant relative to this invention is listed herewith.

U.S. Pat. No. 4,075,709 "Large Capacity Bubble Domain Memory with Redundancy"; Chen et al. In this application there is described a junction which includes a merge element and a passive replicator. In this arrangement the merge merely combines information from a plurality of propagation paths and produces an output (and replicate thereof) pertinent to the input signals.

U.S. Pat. No. 3,832,701; Transfer Circuit for Single Wall Domains; Bobeck et al. This patent shows a representative transfer circuit for bubble domains.

Ser. No. 688,652 and now abandoned; Compact Exchange Switch for Bubble Domain Devices; Chen et al. This application shows a representative transfer switch.

U.S. Pat. No. 4,128,896; One-Level Switch for Magnetic Bubble Domain Devices; George et al. This application shows a representative bubble domain transfer switch.

U.S. Pat. No. 3,543,255; Single Wall Domain Apparatus Having Intersecting Propagation Channels; Morrow et al. This patent describes a bubble domain system wherein information in two channels pass intersections in the channels without interference.

U.S. Pat. No. 3,676,873; Magnetic Bubble Crossover Circuit; Lee. This patent describes a passive crossover circuit for magnetic bubbles but has questionable operation.

SUMMARY OF THE INVENTION

A magnetic bubble domain circuit crossover junction which permits the information streams in two (or more) separate propagation paths to cross each other without deleterious effects on the information streams. The crossover junction includes at least two propagation paths which merge into a common propagation path and an active transfer switch for transferring information from the common propagation path to an output path. The information on the two paths is arranged to become intermixed at the merge and to be separated at the active transfer switch.

Arrangements are made for crossing over a plurality of propagation paths by using properly timed or spaced information, or in the alternative, using a multiple crossover junction arrangement.

DESCRIPTION OF THE PREFERRED EMBODIMENT

Figure 1:
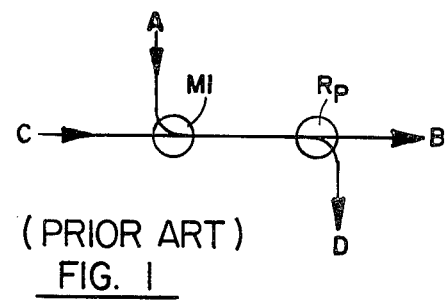
FIG. 1 is a junction device which is known in the prior art.

Referring now to FIG. 1, there is shown a schematic representation of a junction known in the art. In particular, this junction is shown and described in co-pending application Ser. No. 689,313, filed May 24, 1976, entitled Large Capacity Bubble Domain Memory with Redundancy, by Thomas T. Chen, and assigned to the common assignee. While this junction does not provide a crossover network, per se, it is presented herewith as pertinent prior art known to applicant. However, it is clear that in the junction shown in FIG. 1, the information propagating along the path from location A and the information propagating along the path from location C merge at merge device M1 which is known in the art. The merged information then proceeds along the common propagation path to passive replicator $R_p$. At this point, a bubble propagating through the replicator is propagated along the path to location B and along the path to location D. Consequently, this junction has the effect of operating as an OR gate at merge M1 and producing (at replicator $R_p$) replicated (or duplicated) output signals which are a function of the information from location A or location C. In point of fact, there is no "crossover" of information. That is, information presented to locations B and D is the same, irrespective of whether the information came from location A or location C.

Figure 2:
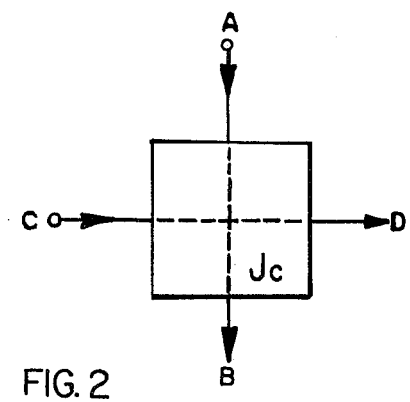
FIG. 2 is a block diagram representing the crossover junction concept of the instant invention.

Referring now to FIG. 2, there is shown a block diagram of a crossover junction $J_c$. Crossover junction $J_c$ is intended to operate so that information at location C will propagate through the junction to location D. Substantially, simultaneously, information from location A will also propagate through junction $J_c$ to location B. Thus, information from locations A and C will be propagated to locations B and D, respectively, without any interaction or interference one from the other.

Figure 3:
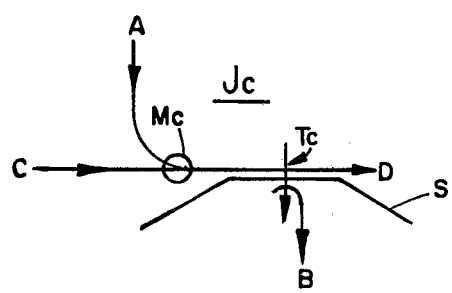
FIG. 3 is a schematic representation of the crossover junction of the instant invention.

Referring now to FIG. 3, there is shown a schematic representation of junction $J_c$. In crossover junction $J_c$, propagation paths from locations A and C are joined together at merge $M_c$. However, the common propagation path subsequent to merge $M_c$ is directed to location D. Consequently, any information propagating from locations A or C will merge and be propagated through to location D.

In addition, subsequent to merge $M_c$ and prior to location D there is provided transfer switch $T_c$ which can be of any known configuration such as the dollar sign ($) switch and the like. Transfer switch $T_c$ is an active switch and requires a control signal to be applied thereto. Switch $T_c$ includes any suitable elements such as a dollar sign, a pick-ax, or any other elements which are represented by the arrow of transfer switch $T_c$. A propagation path associated with transfer $T_c$ is directed to location B. The signal line or conductor S is associated with the active transfer switch in a suitable manner known in the art and dependent upon the specific configuration of transfer switch $T_c$ which is utilized. Thus, information streams propagating from locations A or C come together at merge $M_c$ and propagate along the common propagation path. Typically, the information would propagate to location D. However, upon application of a control signal on conductor S, active transfer switch $T_c$ is operative to transfer information (bubble domains) from the common propagation path to the propagation path which leads to location B. Consequently, information can be transferred and propagated as desired.

Figure 4:
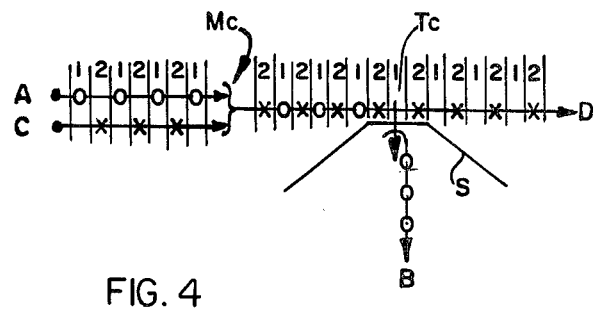
FIG. 4 is a schematic representation of the crossover junction of the instant invention showing information propagating thereon.

Referring now to FIG. 4, there is shown a schematic representation of the operation of crossover junction $J_c$ shown in FIG. 3. In the embodiment shown in FIG. 4, information is propagated from locations A and C. Consequently, two propagation paths are provided. These propagation paths come together at merge $M_c$ as shown best in FIG. 3. It is noted that the information streams supplied by locations A and C are arranged in alternate fashion. Thus, the information generated at location A (represented by open circles) is provided in every other operating cycle. In this instance, the bubbles from location A are provided in the odd numbered cycles (e.g. 1, 3, 5, etc.). Conversely, the information from location C (represented by X's) is provided in the intermediate or even numbered time slots. When this information is merged at merge $M_c$ it is seen that the information alternates along the common propagation path. Thus, the information on this path is o, x, o, x, o, x, and so forth.

By properly arranging the timing, the signal on conductor S is applied in alternate time frames. In this instance, transfer switch $T_c$ is activated in the odd numbered times wherein the information from location A (represented by circles) is transferred to the propagation path leading to location B. Conversely, when transfer switch $T_c$ is not activated, the information from location C represented by (x) is propagated to location D. Consequently, it is seen that information from location A has gone to location B, information from location C has gone to location D and the paths AB and CD have crossed without interference with the information thereon.

Figure 5:
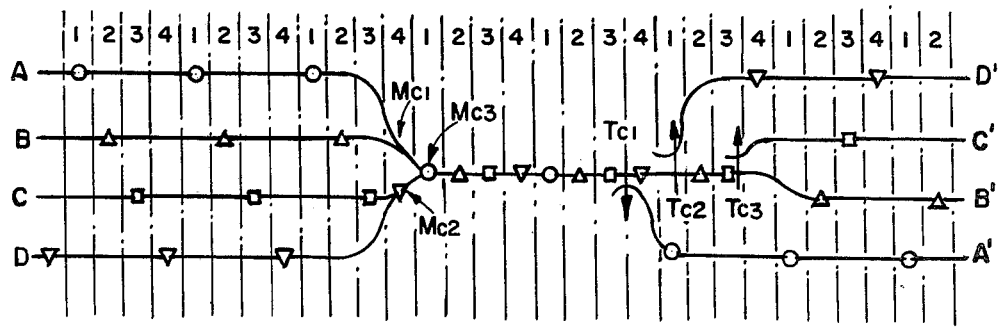
FIG. 5 is a schematic representation of a crossover junction having multiple inputs and multiple outputs.

Referring now to FIG. 5, there is shown another embodiment of the instant invention wherein a multiple number of input lines and a multiple number of output lines are arranged to cross each other in accordance with the instant invention. Thus, it is seen that the line from locations A and B merge at $M_{c1}$ while the lines from locations C and D merge at $M_{c2}$. The combined propagation paths from merges $M_{c1}$ and $M_{c2}$ are combined and merged at merge $M_{c3}$. Of course, the lines can be merged differently, if desirable, so long as the information merger is not confused.

In the embodiment shown, there are four propagation lines. Thus, the information from the respective sources is separated by four bits. Typically, the information from source A is provided during cycle 1. Likewise, the information from sources B, C and D is provided during cycles 2, 3 and 4, respectively. The information is merged onto the common line subsequent to merge $M_{c3}$ and a compact information density along this path is indicated although the same timing or order is preserved.

At an appropriate location along the common propagation path, switch $T_{c1}$ is provided to selectively transfer information from the common propagation line to the propagation line associated with location A'. Similarly, transfer switches $T_{c2}$ and $T_{c3}$ are provided to extract or transfer information from the common line to the appropriate propagation paths associated with locations D' and C', respectively. Location B' receives the information directly along the extended propagation path. Of course, transfer switch $T_{c3}$ can be arranged to operate in the opposite manner wherein the paths associated with B' and C' can be reversed in terms of which is a switch path and which is a continuous path. However, it is noted that the output information streams supplied to locations A', B', C' and D' have the same timing relationship as the input information streams supplied by locations A, B, C and D. Consequently, a plurality of input lines have been connected to a plurality of output lines such that the information has crossed over without any deleterious effect thereon.

Figure 6:
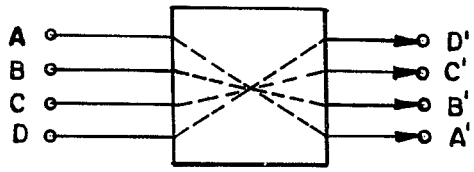
FIG. 6 is a block diagram of another embodiment of the instant invention.

Referring now to FIG. 6, there is shown a block diagram of a multiple-input multiple-output junction. Typically, FIG. 6 can be considered to be a block diagram of the device shown in FIG. 5. However, it is considered that FIG. 6 represents a system wherein the packing density of the information on the input lines is increased and the space between the information is decreased.

Figure 7:
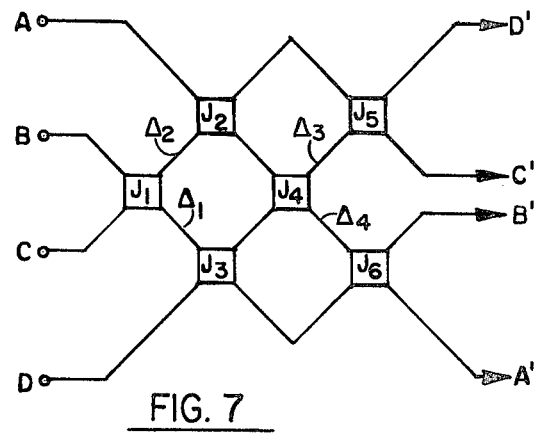
FIG. 7 is a schematic representation of a junction in accordance with the block diagram shown in FIG. 6.

Referring now to FIG. 7, there is shown another crossover junction of the type considered in FIG. 6. Again, inputs A, B, C and D are provided along with outputs A', B', C' and D'. However, the four lines crossover each other by using a plurality of junctions wherein the packing density is retained. Thus, information from location A and information from location C is merged and separated by junction J2. Likewise the information from location A is merged with and separated from the information from location D by means of junction J4. Finally, the information from location A is merged with and separated from the information at location B via junction J6. This information is then transferred to location A' without any interference or adverse effect as a result of crossing over lines associated with locations B, C and D. The information from location B, C and D is propagated to locations B', C' and D' along the paths indicated with the appropriate merging and separating at the respective junctions such as junction J1 through J6.

It has been noted that for best results in this arrangement, the information can be spaced apart by one cycle wherein alternate cycle operation is provided. Thus, the packing density in the information in the device shown in FIG. 7 can be improved by a factor of 2 over the junction shown in FIG. 5.

In addition, in order to simplify the operation, it is desirable to perform as many switching operations at the same time as possible. To this end, it may be desirable to alter the path between the junctions to incorporate either a retard switch (known in the art) or an additional propagation path period to control the time at which information reaches certain of the junctions. For example, it is assumed that the information at locations A and B is provided at alternate time slots and the information at locations C and D is also provided at alternate time slots with information at locations A and C having the same time slots. With this timing arrangement, it is desirable to incorporate a delay $\Delta 2$ between junctions J1 and J2 so that the information at locations A and C is provided to junction J2 at different times and can thus be interspersed. Likewise, a delay $\Delta 1$ is interposed between junctions J1 and J3 to separate the information from locations A and C. In addition, delays $\Delta 3$ and $\Delta 4$ are provided between junctions J4 and J5 and junctions J4 and J6, respectively. It can be seen that, with this arrangement, propagation in each path, i.e. AA′, BB′, CC′ and DD′ has been delayed one cycle. Consequently, the information at the output is all synchronized as it was in the input.

Of course, other switching arrangements may be desired relative to the respective junctions. The alteration of the switching arrangements may require the rearrangement of the delays or retarding operations. Nevertheless, this latter arrangement is considered a function of the operation required and/or desired by the operator.

Thus, there has been shown and described a crossover junction for use with magnetic bubble domains. A crossover junction permits the information stream in one propagation path to crossover the information stream in another propagation path without any deleterious effect on either. By using an active component (i.e. external control) any proven components such as half-disks, asymmetrical chevrons, T-bars or the like can be utilized with confidence. Specific embodiments of the invention have been shown and described. Other embodiments may be suggested to those skilled in the art. However, any modifications which fall within the purview of this description are intended to be included herein. The embodiments shown are intended to be illustrative only and are not intended to be limitative. The scope of the application is defined by the claims appended hereto.

Having thus described a preferred embodiment of the invention, what is claimed is:

1. A crossover junction for permitting streams of magnetic bubble domains in intersecting propagation paths to cross over the respective paths without interference with each other, comprising:
   at least two input propagation paths capable of propagating input bubble domains,
   merge means for joining all of the input propagation paths into a common propagation path and propagating all of the input domains from each of said input propagation paths such that the input bubble domains are interleaved on said common propagation path,
   at least one output propagation path separate from and adjacent to said common propagation path, and
   active transfer switch means selectively joining said common propagation path and said output propagation path
   wherein separate output bubble domains representative of the input bubble domains from a selected input propagation path can be taken from the common propagation path and supplied to said output propagation path in response to the operation of said transfer switch means whereby input bubble domain streams on said input propagation paths can effectively cross each other without interference.

2. The crossover junction recited in claim 1 wherein, said active transfer switch includes means for supplying control signals thereto.

3. The crossover junction recited in claim 2 wherein, said control signals are supplied at a prescribed time which is a function of the cyclic application of input signals along said at least two input propagation paths.

4. The crossover junction recited in claim 1 wherein: said active transfer switch means transfers domains from said common propagation path to said output propagation path such that the domains on said input propagation paths are effectively swapped.

5. The crossover junction recited in claim 1 wherein: said active transfer switch means comprises a plurality of active transfer switch elements in which the number of switch elements is one less than the number of input propagation paths.

6. The crossover junction recited in claim 1 wherein: said input propagation paths comprise a plurality N, said merge means includes N−1 path merges, and said active transfer switch means includes N−1 transfer switches.

7. The crossover junction recited in claim 1 wherein: said active transfer switch means includes electrical conductor means for controlling the operation thereof.

8. The crossover junction recited in claim 1 including:
   delay means connected into said merge means to control the interleaving of the bubble domains.

9. The crossover junction recited in claim 1 wherein: said input propagation paths are arranged in a specified order as related to said input bubble domains, and
   said common propagation path and said output propagation paths are arranged in the reverse order as related to said output bubble domains whereby the bubble domain streams cross over each other without interference.

10. The crossover junction recited in claim 6 wherein: said input bubble domains on each input propagation path are spaced apart by N bubble domain spaces.

* * * * *

UNITED STATES PATENT AND TRADEMARK OFFICE
CERTIFICATE OF CORRECTION

PATENT NO. : 4,346,455
DATED : August 24, 1982
INVENTOR(S) : Thomas T. Chen

It is certified that error appears in the above—identified patent and that said Letters Patent are hereby corrected as shown below:

In Column 1, line 7, please delete "Jomain" and insert --domain--.

Signed and Sealed this

Nineteenth Day of April 1983

[SEAL]

Attest:

GERALD J. MOSSINGHOFF

Attesting Officer   Commissioner of Patents and Trademarks